(12) United States Patent
Chen et al.

(10) Patent No.: US 12,066,475 B2
(45) Date of Patent: Aug. 20, 2024

(54) TWO-STEP CHARGE-BASED CAPACITOR MEASUREMENT

(71) Applicant: Taiwan Semiconductor Manufacturing Company, Ltd., Hsinchu (TW)

(72) Inventors: Tai-Yi Chen, Hsinchu (TW); Chung-Chieh Yang, Hsinchu (TW); Chih-Chiang Chang, Taipei (TW); Chung-Ting Lu, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 183 days.

(21) Appl. No.: 17/231,312

(22) Filed: Apr. 15, 2021

(65) Prior Publication Data

US 2021/0373059 A1 Dec. 2, 2021

Related U.S. Application Data

(60) Provisional application No. 63/031,830, filed on May 29, 2020.

(51) Int. Cl.
| | |
|---|---|
| G01R 27/26 | (2006.01) |
| G01R 31/26 | (2020.01) |
| G01R 31/28 | (2006.01) |
| H03K 19/094 | (2006.01) |

(52) U.S. Cl.
CPC ..... *G01R 27/2605* (2013.01); *G01R 31/2639* (2013.01); *G01R 31/2841* (2013.01); *H03K 19/094* (2013.01)

(58) Field of Classification Search
CPC ............ G01R 27/2605; G01R 31/2639; G01R 31/2841; H03K 19/094
See application file for complete search history.

(56) References Cited

U.S. PATENT DOCUMENTS

2012/0084033 A1* 4/2012 Liu .................... G01R 31/2884
702/65

* cited by examiner

*Primary Examiner* — Amy He
(74) *Attorney, Agent, or Firm* — Jones Day

(57) ABSTRACT

Systems and methods are described herein for charge-based capacitor measurement. The system includes a first pseudo-inverter circuit and a second pseudo-inverter circuit. The system also includes a control circuit coupled between the first inverter circuit and the second inverter circuit. The control circuit is configured to generate independent and non-overlapping control signals for the first pseudo-inverter circuit and the second pseudo-inverter circuit. A shielding metal is coupled to the first pseudo-inverter circuit, the second pseudo-inverter circuit, and the control circuit. The shielding metal is configured to dissipate parasitic capacitance of at least one of the first pseudo-inverter circuit or the second pseudo-inverter circuit. A device under test is coupled to each of the first inverter circuit and the second inverter circuit.

19 Claims, 6 Drawing Sheets

TWO-STEP CHARGE-BASED CAPACITOR MEASUREMENT

PRIORITY CLAIM

The present application claims priority to U.S. Application 63/031,830, filed May 29, 2020, the contents of which is incorporated by reference herein in its entirety.

FIELD

The technology described in this disclosure relates generally to a two-step charge-based capacitor measurement of a device under test.

BACKGROUND

As small scale, mobile, and remote technologies develop (e.g., Internet of Things (IoT)), low power applications become more and more of interest. Metal-oxide-metal (MOM) capacitors can be used for high-resolution applications such as switched capacitors or successive approximate analog-to-digital converter (SAR-ADC). Evaluation of capacitor measurements utilizing the structures described herein can assist with meeting critical criteria of low power circuits in IoT applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

Figure 1:
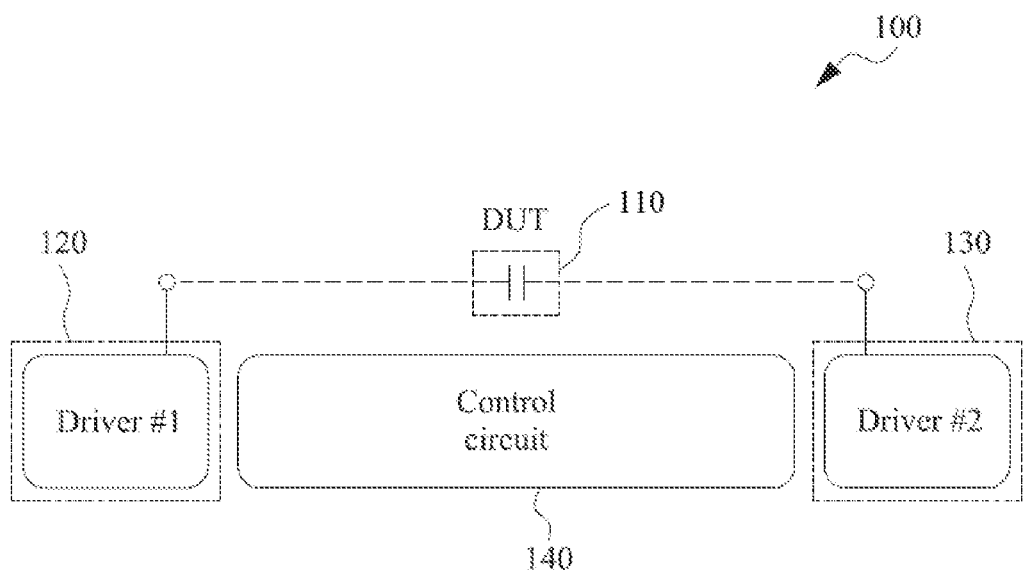
FIG. 1 is an exemplary block diagram illustrating a circuit for charge-based capacitor measurement in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device. Some of the features described below can be replaced or eliminated for different embodiments. Although some embodiments are discussed with operations performed in a particular order, these operations may be performed in another logical order.

High resolution analog circuits, such as analog-to-digital converters (ADC), are used to convert analog signals (e.g., continuous waveform signals) into digital signals (e.g., discrete '1' or '0'). These circuits are used in everyday electronics such as cell phones and laptops. The resolution of a high resolution analog circuit defines the smallest electrical change (e.g., voltage) that can be measured by a circuit. In other words, its resolution determines how precise the high resolution analog circuit is in its measurements. High resolution analog circuits can suffer from MOM mismatch. MOM mismatch occurs, for example, when a pair of MOM devices (e.g., capacitors) should electrically be the same (e.g., same capacitance values or electric/magnetic field induction values) but in reality are electrically different (e.g., different capacitance values or electric/magnetic field induction values). Mismatch can stem from layout design and/or process sensitives. Process sensitivities may be caused by variations across a wafer. For example, uneven etching across a wafer or an uneven flow of gases at one point on a wafer compared to another during a fabrication step may cause component variations from one location to another on a same wafer or on a same chip. Feature density differences may also cause variations in etch rate, thereby creating a process sensitivity. In a damascene process, for example, more critical process sensitivity source comes from Cu chemical mechanical planarization (CMP) (e.g., Cu Pattern density, slurry uniformity, and deformation from polish pad).

While some process variations may be unavoidable, certain measures can be taken to mitigate the effects of those variations. For example, as described herein, electric and magnetic field control can be utilized minimize MOM mismatch (e.g., coupling errors). In embodiments, two-step charge-based measurement systems and methods described herein can detect as well as remedy MOM mismatch using timing adjustments and shielding metal.

FIG. 1 is an exemplary block diagram illustrating a system 100 for charge-based capacitor measurement in accordance with various embodiments of the present disclosure. System 100 includes a device under test (DUT) 110, two driver circuits (e.g., driver #1 120 and driver #2 130), and a control circuit 140. The DUT 110 can include one or more MOM capacitors. The driver circuits 120, 130 are coupled to the DUT 110. Control circuit 140 is coupled to drivers 120, 130. The driver circuits 120, 130 are selectively operated by the control circuit 140 in two separate steps. Whether there is any mismatch in the DUT 110 is determined based on current values measured within the DUT 110 during each of the two steps. Based on these current values, a capacitance of the DUT 110 is determined which in turn identifies whether any mismatch within the DUT 110 exists.

Figure 2:
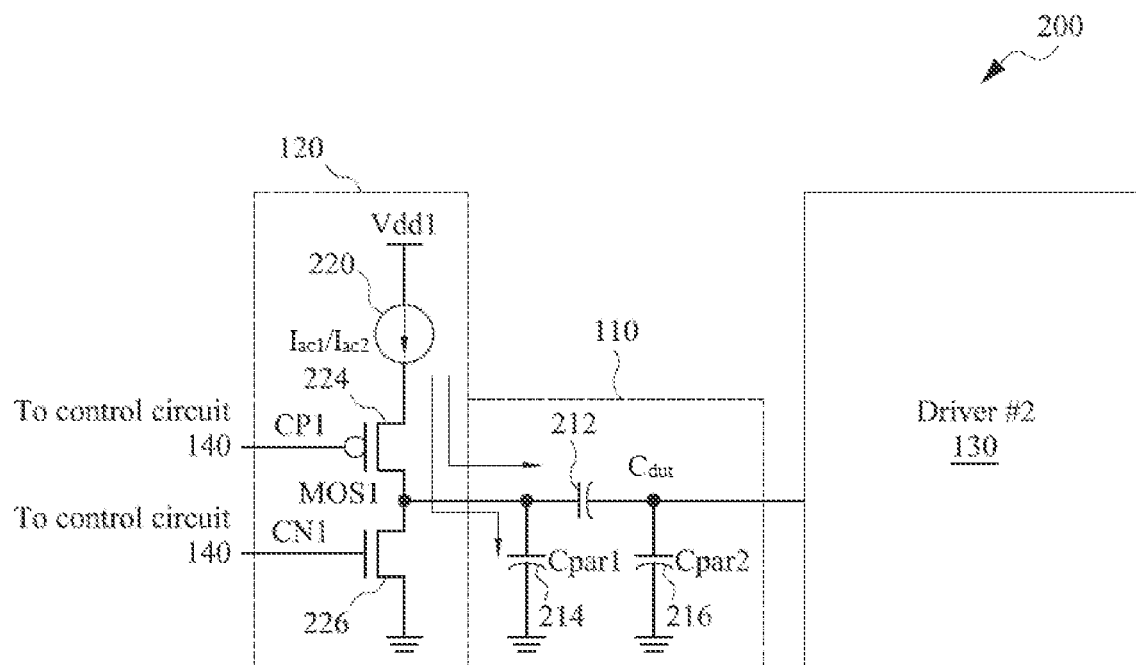
FIG. 2 is an exemplary circuit schematic illustrating electrical components used in connection with the two-stage charge-based capacitor measurement in accordance with various embodiments of the present disclosure.

FIG. 2 is an exemplary circuit schematic 200 illustrating electrical components used in connection with the two-stage charge-based capacitor measurement in accordance with various embodiments of the present disclosure. Driver #1 120 includes a pseudo-inverter circuit having transistors 224, 226. More specifically, a source/drain terminal of a PMOS transistor 224 is coupled to a supply voltage, $V_{dd1}$. Another source/drain terminal of the PMOS transistor is electrically coupled to a source/drain terminal of NMOS transistor 226. Another source/drain terminal of the NMOS transistor 226 is electrically coupled to ground. A gate terminal of the PMOS transistor 224 is electrically coupled to control circuit 140 (not shown in FIG. 2) and receives a control signal, CP1, that controls operation of the PMOS transistor 224. Similarly, a gate terminal of the NMOS transistor 226 is electrically coupled to control circuit 140 (not shown in FIG. 2) and receives a control signal, CN1, that controls operation of NMOS transistor 226.

Figure 3:
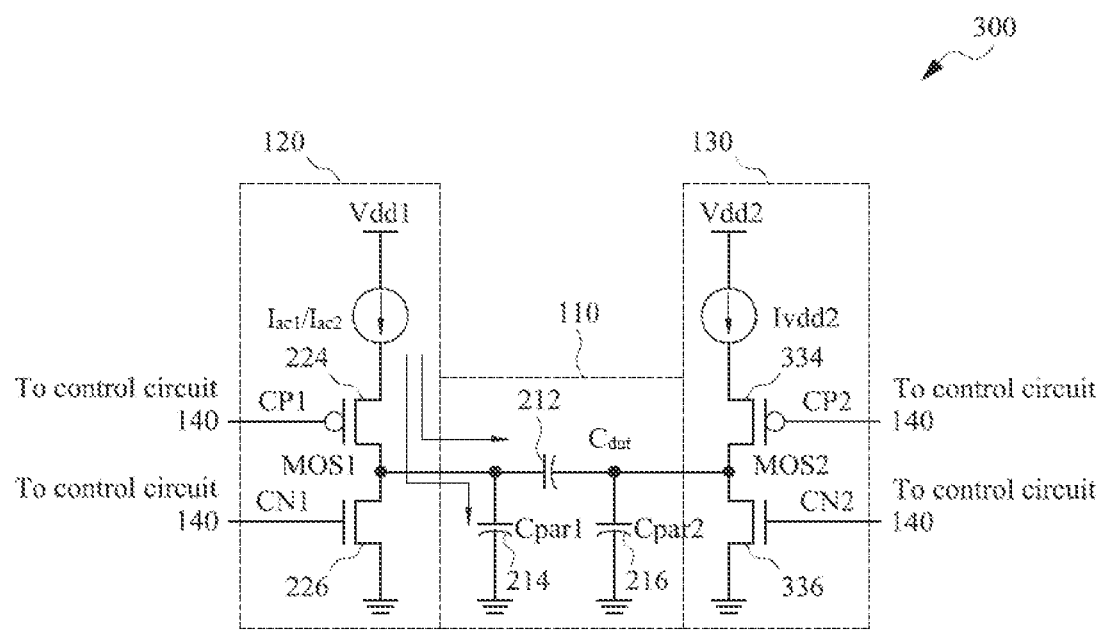
FIG. 3 is another exemplary circuit schematic illustrating electrical components used in connection with the two-stage charge-based capacitor measurement in accordance with various embodiments of the present disclosure.

The MOM mismatch can be determined based on the electrical parameters of driver #1 120 and the device under test 110, dependently of driver #2 130, as described in more detail in FIG. 3. Driver #2 130 includes a pseudo-inverter circuit having transistors 334, 336. More specifically, a source/drain terminal of a PMOS transistor 334 is coupled to a voltage source, $V_{dd2}$. Another source/drain terminal of the PMOS transistor 334 is electrically coupled to a source/drain terminal of NMOS transistor 336. Another source/drain terminal of the NMOS transistor 336 is electrically coupled to ground. A gate terminal of the PMOS transistor 334 is electrically coupled to control circuit 140 (not shown in FIG. 3) and receives a control signal, CP2, that controls operation of the PMOS transistor 334. Similarly, a gate terminal of the NMOS transistor 336 is electrically coupled to control circuit 140 (not shown in FIG. 3) and receives a control signal, CN2, that controls operation of NMOS transistor 336. DUT 110 is electrically coupled between driver #1 120 and driver #2 130. More specifically, the DUT 110 is electrically coupled at one end to the common coupling of the source/drain terminals of PMOS transistor 224 and NMOS transistor 226 and at another end to the common coupling of the source/drain terminals of PMOS transistor 334 and NMOS transistor 336. In a first measurement step, the control signal CP1 and control signal CN1 are logic lows ('0') and the control signal CP2 and control signal CN2 are logic highs ('1'). When the control signal CP1 is a logic low, PMOS transistor 224 acts as a closed switch. When the control signal CN1 is a logic low, NMOS transistor 226 acts as an open switch. In other words, the voltage supply, $V_{dd1}$, is coupled to a terminal of both the parasitic capacitor 214 and the capacitance of the device under test, $C_{dut}$, 212. When the control signal CP2 is a logic high, PMOS transistor 334 acts as an open switch and the supply voltage, $V_{dd2}$, remains electrically uncoupled from the capacitor for the device under test, $C_{dut}$ 212. When the control signal CN2 is a logic high, NMOS transistor 336 acts as a closed switch and electrically connects a terminal of the capacitor for the device under test, $C_{dut}$ 212 to ground. Due to operation of the driver #2 130 as discussed in more detail in FIG. 3, the capacitance of the device under test, $C_{dut}$, 212, is tied to ground. With these configurations of the transistors within driver #1 120, the current $I_{ac1}$ flowing through the circuit can be characterized as follows:

$$I_{ac1} = (C_{dut} + C_{par1})(V_{dd1})(f) \tag{1}$$

where $C_{dut}$ is the capacitance of the device under test 212, $C_{par1}$ is the parasitic capacitance of parasitic capacitor 214, $V_{dd1}$ is a supply voltage, and f is a frequency associated with the control signals generated by control circuit 140.

During a second measurement step, the control signals CP1, CN1, CP2, and CN2 are all logic lows ('0'). When the control signal CP1 is a logic low, PMOS transistor 224 acts as a closed switch. When the control signal CN1 is a logic low, NMOS transistor 226 acts as an open switch. When the control signal CP2 is a logic low, PMOS transistor 334 acts as a closed switch. When the control signal CN2 is a logic low, NMOS transistor 336 acts as an open switch. In other words, PMOS transistor 224 facilitates electrical coupling of the voltage source, $V_{dd1}$, to the parasitic capacitor 214. With these configurations of the transistors within driver #1 120, the current $I_{ac2}$ flowing through the circuit can be characterized as follows:

$$I_{ac2} = (C_{par1})(V_{dd1})(f). \tag{2}$$

The capacitance of the device under test, $C_{dut}$, 212 is calculated by subtracting Equation (2) from Equation (1) which results in the following expression:

$$C_{dut} = \frac{I_{ac1} - I_{ac2}}{Vdd_1(f)} \tag{3}$$

where $I_{ac1}$ is the current measured during the first measurement step, and $I_{ac2}$ is the current measured during the second measurement step. The standard deviation of this calculation can be expressed as follows:

$$sd\{I_{ac1} - I_{ac2}\} \approx \sqrt{sd\{I_{ac1}\}^2 + sd\{I_{ac2}\}^2} \tag{4}$$

where sd represents the standard deviation function.

FIG. 3 is another exemplary circuit schematic 300 illustrating electrical components used in connection with the two-stage charge-based capacitor measurement in accordance with various embodiments of the present disclosure. Driver #2 130, also known as a dummy driver, includes a pseudo-inverter circuit having two transistors 334, 336. More specifically, a source/drain terminal of a PMOS transistor 334 is electrically coupled to a voltage source, $V_{dd2}$. Another source/drain terminal of the PMOS transistor 334 is electrically coupled to a source/drain terminal of NMOS transistor 336. Another source/drain terminal of the NMOS transistor 336 is electrically coupled to ground. A gate terminal of the PMOS transistor 334 is coupled to control circuit 140 (not shown in FIG. 3) and receives a control signal, CP2, that controls operation of the PMOS transistor 334. Similarly, a gate terminal of the NMOS transistor 336 is electrically coupled to control circuit 140 (not shown in FIG. 3) and receives a control signal, CN2, that controls operation of NMOS transistor 336.

In some embodiments, driver #2 130 can be referred to a dummy circuit. Driver #1 120 is associated with a first power domain. Driver #2 130 is associated with a second power domain. The first power domain and the second power domain are independent and different from one another. Control signals CN1, CN2, CP1, CP2 are all non-overlapping signals that are also independent of one another.

DUT 110 is electrically coupled between driver #1 120 and driver #2 130. More specifically, the DUT 110 is electrically coupled at one end to the common coupling of the source/drain terminals of PMOS transistor 224 and NMOS transistor 226. DUT 110 is electrically coupled at another end to the common coupling of the source/drain terminals of PMOS transistor 334 and NMOS transistor 336. As illustrated in FIG. 3 the DUT 110 can characterized by a capacitance, $C_{dut}$, 212. Additionally, the coupling of driver #1 120 to the DUT 110 creates a parasitic capacitance represented by $C_{par1}$ 214. Likewise, the coupling of driver #2 130 to the DUT 110 also creates a parasitic capacitance represented by $C_{par2}$ 216.

During a first measurement step (as shown in FIG. 3), the control signal CP1 and control signal CN1 are logic lows ('0') and the control signals CP2 and CN2 are logic highs ('1'). When the control signal CP1 is a logic low, PMOS transistor 224 acts as a closed switch. When the control signal CN1 is a logic low, NMOS transistor 226 acts as an open switch. In other words, the voltage supply, $V_{dd1}$, is coupled to a terminal of both the parasitic capacitor 214 and the capacitance of the device under test, $C_{dut}$, 212. Similarly, when the control signal CP2 is a logic high, the PMOS transistor 334 acts as an open switch and the supply voltage, $V_{dd2}$, remains electrically uncoupled from the capacitor for the device under test, $C_{dut}$, 212. When the control signal CN2 is a logic high, the NMOS transistor 336 acts as an closed switch and electrically connects a terminal of the capacitor for the device under test, $C_{dut}$, 212 to ground. With these configurations of the transistors within driver #1 120 and driver #2 130, the current lad flowing through the circuit can be characterized by Equation (1).

During a second measurement step, the control signals CP1, CN1, CP2, CN2 are all logic lows ('0'). When the control signal CP1 is a logic low, PMOS transistor 224 acts as a closed switch. When the control signal CN1 is a logic low, NMOS transistor 226 acts as an open switch. Similarly, when the control signal CP2 is a logic low, PMOS transistor 334 acts as an closed switch. When the control signal CN2 is a logic low, NMOS transistor 336 acts as an open switch. In other words, PMOS transistor 224 facilitates electrical coupling of the voltage source, $V_{dd1}$, to the parasitic capacitor 214. With these configurations of the transistors with driver #1 120 and driver #2 130, the current $I_{ac2}$ flowing through the circuit can be characterized by Equation (2).

Figure 4:
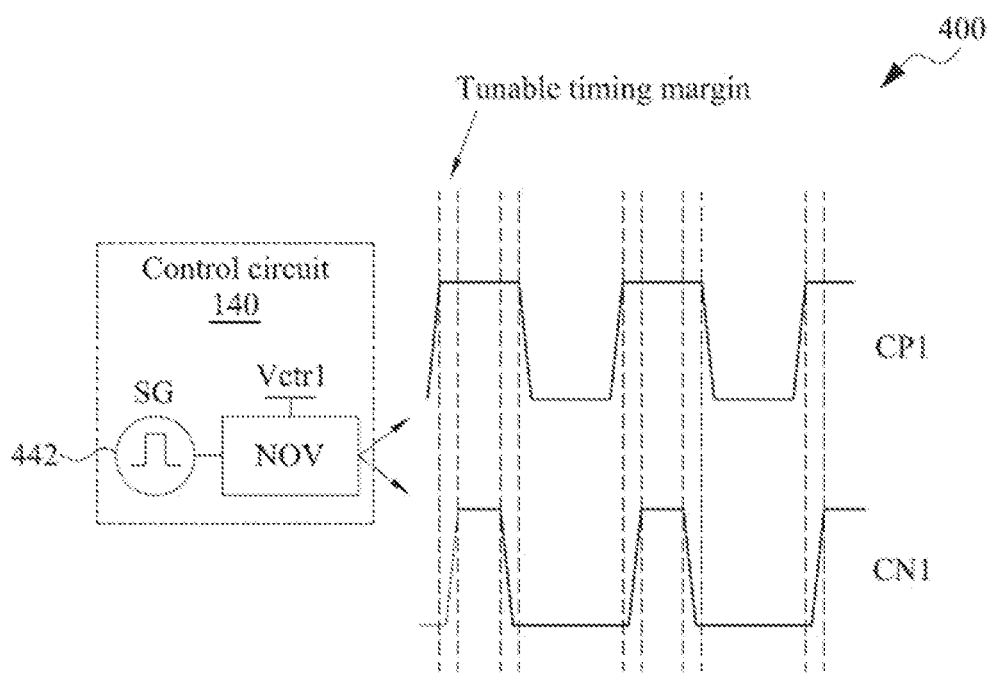
FIG. 4 is an exemplary diagram illustrating a control circuit that generates timing diagram of the control signals CN1 and CP1 input into driver #1 in accordance with various embodiments of the present disclosure.

FIG. 4 is an exemplary diagram 400 illustrating a control circuit that generates timing diagram of the control signals CN1 and CP1 input into driver #1 in accordance with various embodiments of the present disclosure. The control circuit 140 includes a signal generator (SG) 442 coupled to an NOV circuit (NOV). The NOV circuit (NOV) is driven by a control voltage, Vctrl. The NOV circuit (NOV) generates control signal CP1 that is provided to the gate of the PMOS transistor 224 and control signal CN1 that is provided to the gate of the NMOS transistor 226. As illustrated in the timing diagram of FIG. 4, each control signal CP1 and CN1 are independent, non-overlapping signals. The timing difference between the rising/falling edges of the control signal CP1 and the rising/falling edges of the control signal CN1 is a tunable timing margin. This timing margin can be adjusted using control circuit 140.

Figure 5:
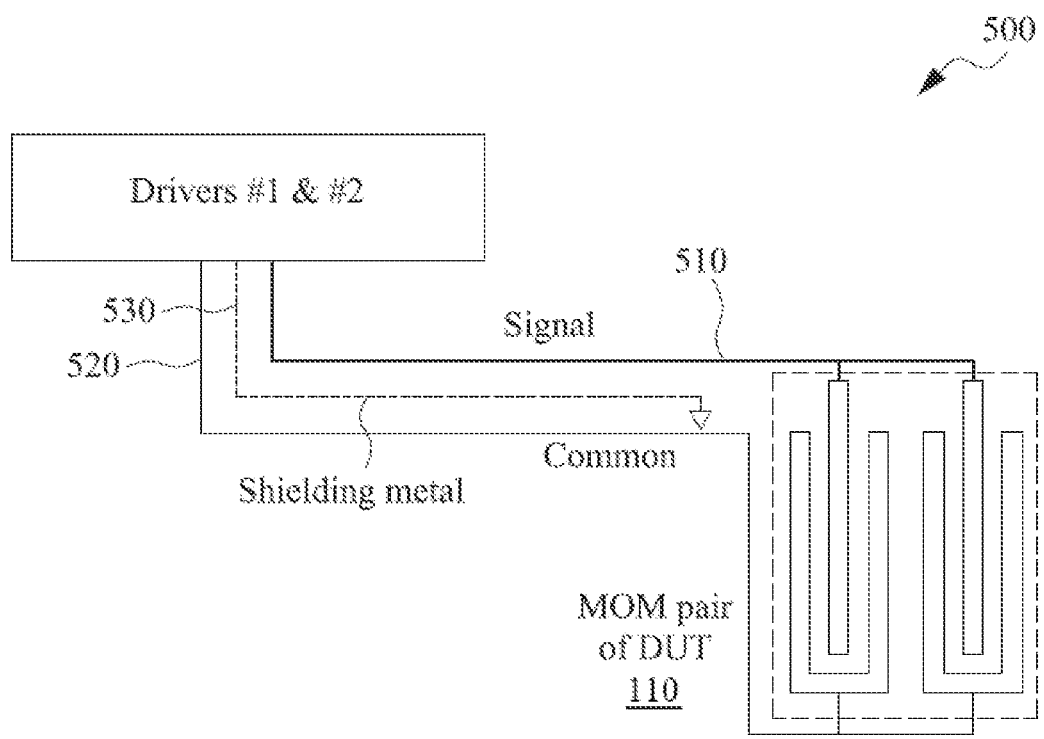
FIG. 5 is an exemplary diagram illustrating physical coupling of drivers to the device under test of FIG. 1 in accordance with various embodiments of the present disclosure.

FIG. 5 is an exemplary diagram 500 illustrating physical coupling of drivers to the device under test 110 of FIG. 1 in accordance with various embodiments of the present disclosure. As previously discussed in FIG. 1, driver #1 120 and driver #2 130 are electrically coupled to the device under test 110. This device under test 110 includes an MOM transistor pair that may have a mismatch. The electrical coupling between the drivers and the MOM pair of the device under test 110 includes a signal channel 510, a common channel 520, and a shielding metal 530. The shielding metal 530 dissipates some of the parasitic capacitance of at least one of the driver #1 120 or the driver #2 130.

Figure 6:
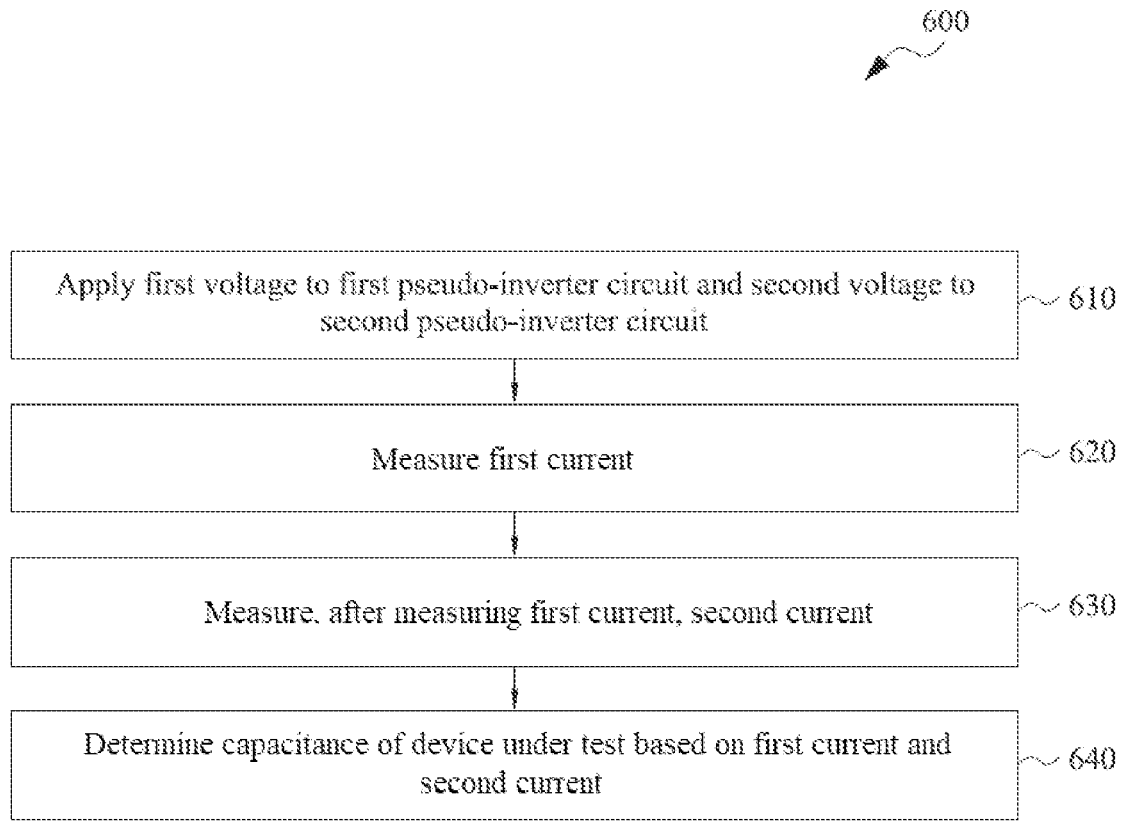
FIG. 6 is an exemplary flow chart illustrating a method of measuring a charge-based capacitor in accordance with various embodiments of the present disclosure.

FIG. 6 is an exemplary flow chart 600 illustrating a method of measuring a charge-based capacitor in accordance with various embodiments of the present disclosure. While FIG. 6 is described here with reference to previously described structures for ease in understanding, it is understood that the method applies to many other structures as well. At step 610, a first voltage, $V_{dd1}$, is applied to a first pseudo-inverter circuit (e.g., driver #1 120 having PMOS transistor 224 and NMOS transistor 226) and a second voltage, $V_{dd2}$ is applied to a second pseudo-inverter circuit (e.g., driver #2 130 having PMOS transistor 334 and NMOS transistor 336). The device under test 110 is coupled between the first pseudo-inverter circuit (e.g., driver #1 120 having PMOS transistor 224 and NMOS transistor 226) and the second pseudo-inverter circuit (e.g., driver #2 130 having PMOS transistor 334 and NMOS transistor 336). At step 620, a first current ($I_{ac1}$) is measured. The first current ($I_{ac1}$) includes a current of the device under test and a current of a parasitic capacitance (e.g., characterized by Equation (1)). After measuring of the first current ($I_{ac1}$), at step 630, a second current ($I_{ac2}$) is measured (e.g., characterized by Equation (2)). At step 640, a capacitance of the device under test, $C_{dut}$, is determined based on the first current ($I_{ac1}$) and the second current ($I_{ac2}$) (e.g., characterized by Equation (3)).

Use of the various circuits and methods as described herein can provide a number of advantages. For example, testing accuracy can be improved due to lower current standard deviation. The circuits and methods described herein provide better timing margin control by $V_{ctrl}$. Additional parasitic capacitor between common channel and signal channel can be removed by the insertion of the shielding metal.

In one embodiment, a system for charge-based capacitor measurement includes a first pseudo-inverter circuit, a second-pseudo inverter circuit, a control circuit, and a shielding metal. The control circuit is coupled between the first pseudo-inverter circuit and the second pseudo-inverter circuit. The control circuit is configured to generate independent and non-overlapping control signals for the first pseudo-inverter circuit and the second pseudo-inverter circuit. The shielding metal is coupled to the first pseudo-inverter circuit, the second pseudo-inverter circuit, and the control circuit. The shielding metal is configured to dissipate parasitic capacitance of at least one of the first pseudo-inverter circuit or the second pseudo-inverter circuit. A device under test is coupled to each of the first pseudo-inverter circuit and the second pseudo-inverter circuit.

In another embodiment, a method for charge-based capacitor measurement includes applying a first voltage to a first pseudo-inverter circuit and a second voltage to a second pseudo-inverter circuit. The device under test is coupled between the first pseudo-inverter circuit and the second pseudo-inverter circuit. The method further includes measuring a first capacitance of the device under test. The first capacitance includes a capacitance of the device under test and a parasitic capacitance. The method also includes measuring, after measuring of the first capacitance, the parasitic capacitance. Lastly, the method includes determining the capacitance of the device under test based on the first capacitance and the parasitic capacitance.

In yet another embodiment, a system for charge-based capacitor measurement includes a first driver circuit, a second driver circuit, and a control circuit coupled between the first driver circuit and the second driver circuit. The control circuit is configured to generate independent and non-overlapping control signals for the first driver circuit and the second driver circuit. A device under test is coupled to each of the first driver circuit and the second driver circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    applying a first voltage to a first transistor of a first pseudo-inverter circuit and a second voltage to a second transistor of a second pseudo-inverter circuit, wherein a device under test is coupled between the first pseudo-inverter circuit and the second pseudo-inverter circuit, a third transistor is coupled between the first transistor and ground, and a fourth transistor is coupled between the second transistor and the ground; and
    performing only two measurement steps, wherein:
        during a first measurement step, the first and fourth transistors are turned on, the second and third transistors are turned off, and a first current, induced by a capacitance of the device under test and a parasitic capacitance, is measured; and
        during a second measurement step, the first and second transistors are turned on, the third and fourth transistors are turned off, and a second current, induced by the parasitic capacitance, is measured, and wherein a capacitance ($C_{dut}$) of the device under test is expressed as follows:

$$C_{dut} = \frac{I_{ac1} - I_{ac2}}{V_{dd1}(f)}$$

where $I_{ac1}$ is the first current, $I_{ac2}$ is the second current, $V_{dd1}$ is the first voltage, and f is a clock frequency.

2. The method of claim 1, wherein, during the first measurement step, first control signals applied to the first pseudo-inverter circuit and the second pseudo-inverter circuit facilitate characterization of the first current and wherein, during the second measurement step, second control signals applied to the first pseudo-inverter circuit and the second pseudo-inverter circuit facilitate characterization of the second current.

3. The method of claim 1, wherein each of the first pseudo-inverter circuit and the second pseudo-inverter circuit is configured to be controlled with a plurality of control signals that are independent input signals.

4. The method of claim 1, wherein the first pseudo-inverter circuit is coupled to a first power supply, the second pseudo-inverter circuit is coupled to a second power supply, the first power supply is configured to generate the first voltage, and the second power supply is configured to generate the second voltage.

5. The method of claim 1, wherein the first and third transistors are coupled together in series and the second and fourth transistors are coupled together in series.

6. A method comprising:
    applying a plurality of control signals to PMOS and NMOS transistors of a first pseudo-inverter circuit and PMOS and NMOS transistors of a second pseudo-inverter circuit, wherein a device under test is coupled between the first and second pseudo-inverter circuits; and
    performing only two measuring steps, wherein, during first and second measuring steps, first and second currents are measured, respectively, wherein the first current is induced by a capacitance of the device under test and a parasitic capacitance, wherein the second current is induced by the parasitic capacitance, and wherein a capacitance (Caw) of the device under test is expressed as follows:

$$C_{dut} = \frac{I_{ac1} - I_{ac2}}{V_{dd1}(f)}$$

where $I_{ac1}$ is the first current, $I_{ac2}$ is the second current, $V_{dd1}$ is a voltage applied to the first pseudo-inverter circuit, and f is a frequency associated with the plurality of control signals.

7. The method of claim 6, wherein a control circuit is configured to generate the plurality of control signals.

8. The method of claim 6, further comprising the first pseudo-inverter circuit turning on and off the PMOS and NMOS transistors thereof, respectively, in response to the plurality of control signals.

9. The method of claim 6, further comprising the second pseudo-inverter circuit turning on and off the PMOS and NMOS transistors thereof, respectively, in response to the plurality of control signals.

10. The method of claim 6, wherein a power supply is configured to apply a voltage to the first pseudo-inverter circuit.

11. The method of claim 6, wherein a power supply is configured to apply a voltage to the second pseudo-inverter circuit.

12. The method of claim 6, wherein a second parasitic capacitance is coupled to a node between the device under test and the second pseudo-inverter circuit.

13. A method comprising:
    receiving a supply voltage by a first pseudo-inverter circuit, wherein a device under test is coupled between the first pseudo-inverter circuit and a second pseudo-inverter circuit; and performing only two measurement steps, wherein:
in a first measurement step, receiving a plurality of control signals by the first and second pseudo-inverter circuits such that a first current flowing through the first pseudo-inverter circuit is measured and is characterized as follows:

$Iac1 = (C_{dut} + C_{par1})(V_{dd1})(f)$ where Iac1 is the first current, Cpar1 is a parasitic capacitance created by the coupling of the first pseudo-inverter circuit and the device under test, Vdd1 is the supply voltage, and f is a frequency associated with the plurality of control signals; and in a second measurement step, receiving the plurality of control signals by the first and second pseudo-inverter circuits such that a second current flowing through the first pseudo-inverter circuit is measured, and wherein a capacitance ($C_{dut}$) of the device under test is expressed as follows:

$$C_{dut} = \frac{I_{ac1} - I_{ac2}}{V_{dd1}(f)}$$

where $I_{ac2}$ is the second current.

14. The method of claim 13, wherein a control circuit is configured to apply the plurality of control signals to the first pseudo-inverter circuit and the second pseudo-inverter circuit.

15. The method of claim 13, further comprising the first pseudo-inverter circuit turning on and off transistors thereof in response to the plurality of control signals.

16. The method of claim 13, further comprising the second pseudo-inverter circuit turning on and off transistors thereof in response to the plurality of control signals.

17. The method of claim 13, wherein a power supply is configured to apply the supply voltage to the first pseudo-inverter circuit.

18. The method of claim 13, wherein a power supply is configured to apply a voltage to the second pseudo-inverter circuit.

19. The method of claim 13, wherein a second parasitic capacitance is coupled to a node between the device under test and the second pseudo-inverter circuit.

* * * * *